| United States Patent [19] | [11] Patent Number: 4,954,365 |
| Neifeld | [45] Date of Patent: Sep. 4, 1990 |

[54] METHOD OF PREPARING A THIN DIAMOND FILM

[75] Inventor: Richard A. Neifeld, Springfield, N.J.

[73] Assignee: The United States of America as represented by the Secretary of the Army, Washington, D.C.

[21] Appl. No.: 451,699

[22] Filed: Dec. 18, 1989

[51] Int. Cl.$^5$ .............................................. B05D 3/06
[52] U.S. Cl. .............................. 427/53.1; 427/430.1; 427/443.2
[58] Field of Search ................... 427/53.1, 443.2, 430.1

[56] References Cited

FOREIGN PATENT DOCUMENTS 206-603A 12/1986 European Pat. Off. ........... 427/53.1

Primary Examiner—Bernard Pianalto
Attorney, Agent, or Firm—Michael Zelenka; Roy E. Gordon

[57] ABSTRACT

A thin diamond film is prepared by immersing a substrate in a liquid containing carbon and hydrogen and then subjecting the substrate to at least one laser pulse.

9 Claims, No Drawings

METHOD OF PREPARING A THIN DIAMOND FILM

The invention described herein may be manufactured, used, and licensed by or for the Government for governmental purposes without the payment to me of any royalty thereon.

This invention relates to a method of preparing a thin diamond film

BACKGROUND OF THE INVENTION

There has been a strong desire in the art to prepare diamond thin films. This has been due to the desirable physical properties of diamonds such as large band gap, high dielectric breakdown strength, high thermal conductivity, hardness, optical and ultraviolet transparency, and high electron mobility. Heretofore diamond films have generally been prepared by low vapor pressure non equilibrium growth techniques such as hot filament, glow discharge, chemical vapor deposition (CVD), and plasma enhanced CVD. These techniques, though capable of polycrystalline diamond thin film growth, are expensive due to the requirement of a vacuum chamber and the associate low throughput. Other drawbacks to these techniques include high power consumption and a high degree of process control.

SUMMARY OF THE INVENTION

The general object of this invention is to prepare diamond thin films. A more particular object of the invention is to overcome the difficulties in the fabrication of diamond thin films mentioned heretofore. A particular object of the invention is to provide a method of making a diamond thin film that will be characterized by high thermal conductivity, large band gap, and high electron mobility, or the properties that are desired for electronic devices.

It has now been found that the aforementioned objects can be attained by subjecting a substrate immersed in a liquid containing carbon and hydrogen to a laser pulse.

PREFERRED EMBODIMENT

A diamond thin film is prepared according to the invention in the following manner.

A silicon substrate is immersed in methanol. The methanol is contained in a vessel which has a quartz window. An excimer laser pulse, with wavelength of 248 nanometers (nm) and pulse duration of about 20 nanoseconds (ns) is propagated through the quartz window and through the methanol. This laser pulse is intercepted by the silicon substrate. This substrate is heated by absorption of the laser pulse. The methanol in contact with the heated substrate is pyrolyzed. Carbon material from the pyrolyzed methanol then grows on the substrate, and the high density of hydrogen reacts with and removes from the substrate any carbon which does not have diamond bonds.

Repeated application of the laser pulse continues growth of the diamond film.

Diamond films prepared by this method are less expensive and simpler to produce due to the simpler processing equipment required and lower total power consumed.

In lieu of the silicon substrate, any substrate can be used that is absorptive to the laser light used.

In lieu of the excimer laser disclosed in the preferred embodiment, one might use another pulsed laser which has the following properties: the substrate used can be heated by the laser to about 1000° C., with each laser pulse; and the liquid and window used are transparent to the laser pulse.

In lieu of the methanol disclosed in the preferred embodiment, any liquid that contains both carbon and hydrogen and that is transparent to the laser pulse can be used in the invention. Included within the scope of the invention as the liquid is the use of benzene, ethanol, acetic acid, toluene, etc.

In the preferred embodiment the growing film can be easily doped during growth to provide desired n, or p type semi-conducting behavior. This is done by introducing dopant elements into the liquid prior to subjecting the substrate to the laser pulse.

The method of the invention is believed to work because it produces partial pressures of carbon and hydrogen and temperatures that are known to favor diamond ($SP_3$ bonding of carbon) growth.

I wish it to be understood that I do not desire to be limited to the exact details of construction as described for obvious modifications will occur to a person skilled in the art.

What is claimed is:

1. Method of preparing a thin diamond film from a substrate immersed in a liquid containing carbon and hydrogen comprising subjecting the substrate to at least one laser pulse.

2. Method according to claim 1 wherein the substrate immersed in the liquid is contained in a transparent vessel.

3. Method according to claim 1 wherein the substrate used can be heated by the laser to about 1000° C. with each laser pulse.

4. Method according to claim 1 wherein the liquid used is transparent to the laser pulse.

5. Method according to claim 1 wherein the laser pulse is an excimer laser pulse with wavelength of about 248 nanometers and pulse duration of about 20 nanoseconds.

6. Method according to claim 1 wherein the liquid used is methanol.

7. Method according to claim 1 wherein the substrate is a silicon substrate.

8. Method according to claim 1 wherein repeated application of the laser pulse continues growth of the diamond film.

9. Method of preparing a thin diamond film from a silicon substrate immersed in methanol in a transparent vessel comprising subjecting the substrate to at least one laser pulse from an excimer laser with wavelength of about 248 nanometers and pulse duration of about 20 nanoseconds.

* * * * *